(12) United States Patent
Kurihara et al.

(10) Patent No.: US 7,604,709 B2
(45) Date of Patent: Oct. 20, 2009

(54) PLASMA PROCESSING APPARATUS

(75) Inventors: Masaru Kurihara, Kawasaki (JP); Naoyuki Kofuji, Tama (JP); Naoshi Itabashi, Hachioji (JP); Takashi Tsutsumi, Kawasaki (JP)

(73) Assignees: Hitachi, Ltd., Tokyo (JP); Hitachi High-Technologies Corporation, Tokyo (JP)

( * ) Notice: Subject to any disclaimer, the term of this patent is extended or adjusted under 35 U.S.C. 154(b) by 0 days.

(21) Appl. No.: 10/247,555

(22) Filed: Sep. 20, 2002

(65) Prior Publication Data
US 2004/0026040 A1     Feb. 12, 2004

(30) Foreign Application Priority Data
Aug. 6, 2002  (JP) ............... 2002-228093

(51) Int. Cl.
*H01L 21/306*  (2006.01)
*C23C 16/00*   (2006.01)

(52) U.S. Cl. .............. 156/345.48; 118/723 I; 118/723 AN

(58) Field of Classification Search ........... 118/723 I, 118/723 IR, 723 AN; 156/345.48, 345.49; 315/111.51
See application file for complete search history.

(56) References Cited

U.S. PATENT DOCUMENTS

| | | | | |
|---|---|---|---|---|
| 4,990,229 A | * | 2/1991 | Campbell et al. | 204/298.06 |
| 5,261,962 A | * | 11/1993 | Hamamoto et al. | 118/723 I |
| 5,404,079 A | | 4/1995 | Ohkuni et al. | 315/111.81 |
| 5,531,834 A | * | 7/1996 | Ishizuka et al. | 118/723 I |
| 5,685,942 A | * | 11/1997 | Ishii | 156/345.48 |
| 5,900,699 A | * | 5/1999 | Samukawa et al. | 315/111.51 |
| 5,907,221 A | * | 5/1999 | Sato et al. | 315/111.51 |
| 5,919,382 A | * | 7/1999 | Qian et al. | 219/121.52 |
| 5,936,352 A | | 8/1999 | Samukawa et al. | 315/111.51 |
| 6,030,667 A | * | 2/2000 | Nakagawa et al. | 427/569 |
| 6,036,878 A | | 3/2000 | Collins | 216/68 |
| 6,043,608 A | * | 3/2000 | Samukawa et al. | 315/111.51 |
| 2001/0008171 A1 | | 7/2001 | Fukuda et al. | 156/345 |

FOREIGN PATENT DOCUMENTS

JP         6-111996         4/1994

(Continued)

OTHER PUBLICATIONS

Kakuta, S. et al., "Experimental Study of Very-High-Frequency Plasmas in $H_2$ by Spatiotemporally Resolved Optical Emission Spectroscopy," *Jpn. J. Appl. Phys.*, vol. 33, 1994, pp. 4335-4339.

(Continued)

*Primary Examiner*—Luz L. Alejandro
(74) *Attorney, Agent, or Firm*—Miles & Stockbridge P.C.

(57) ABSTRACT

A plasma processing apparatus which stably and continuously generates a uniform plasma to process large-diameter wafers using a wide range of seed gases under wide-ranging pressure and density conditions and can be thus used for a wide range of applications, ensuring a high production efficiency. The plasma processing apparatus, which introduces electromagnetic waves through a dielectric window into a reduced pressure vessel, has at least two antenna elements which are rotationally symmetrical. One end of each antenna is grounded and power is fed from a high frequency power supply to the other end in the same or virtually same phase.

42 Claims, 13 Drawing Sheets

FOREIGN PATENT DOCUMENTS

| | | |
|---|---|---|
| JP | 6-275397 | 9/1994 |
| JP | 10-12396 | 1/1998 |
| JP | 10-70108 | 3/1998 |
| JP | 10-125663 | 5/1998 |
| JP | 10-189296 | 7/1998 |
| JP | 11-135438 | 5/1999 |
| JP | 2000-111996 | 4/2000 |
| JP | 2002-100615 | 4/2002 |

OTHER PUBLICATIONS

Kitajima, T. et al., "Functional separation of biasing and sustaining voltages in two-frequency capacitively coupled plasma," *Applied Physics Letters*, vol. 77, Jul. 2000, pp. 489-491.

* cited by examiner

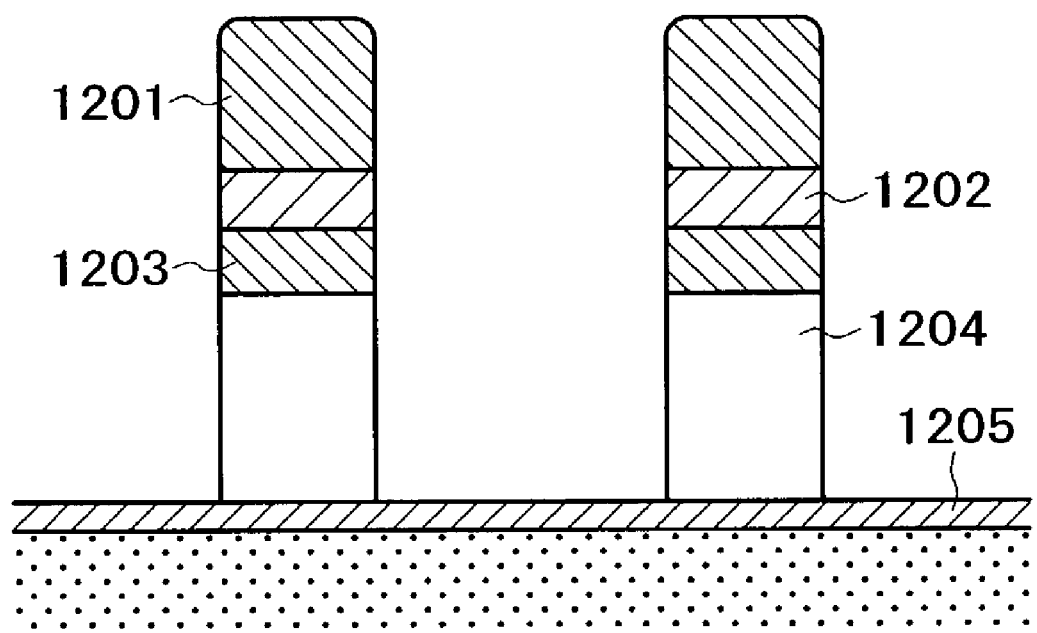
F I G. 1 2

PLASMA PROCESSING APPARATUS

BACKGROUND OF THE INVENTION

1. Field of the Invention

The present invention relates to a plasma processing apparatus which turns a source gas into a plasma and processes the surface of a solid material such as a semiconductor by physical or chemical interaction of activated particles.

2. Description of the Related Art

It is known that there are plasma processing apparatuses as given below which are designed to generate plasmas with improved performance (uniformity, stability, etc.) for processing semiconductor material surfaces.

JP-A No.111996/1994 discloses a method in which N electrodes are rotationally symmetrical and RF (13.56 MHz) power is impressed on each of the electrodes, with the phase varying in steps of 360 degrees/N.

JP-A NO. 135438/1999 describes a method in which linear conductors are positioned radially from a center and grounded at their outer ends and RF power is impressed on them.

JP-A No.125663/1998 reveals a method in which RF power is impressed on conductive windings extending spirally from a center.

JP-A No.111996/2000 also discloses a method in which UHF high frequency power is impressed on each of rotationally symmetrical N antenna elements whose length is a quarter of the wavelength of the high frequency power to be impressed, with the phase varying in steps of 360 degrees/N.

JP-A No.70108/1998 suggests a method in which UHF high frequency power is respectively impressed on radially extending bar conductors with a length equivalent to a quarter of the wavelength of the high frequency power to be impressed, and on bar conductive antennas extending from a peripheral ring-like conductor toward the center, with a phase difference of 180 degrees.

In connection with processing with a plasma, conventional methods for discharge in a frequency band of several megahertz to 100 MHz include parallel plate capacitive coupling and inductive coupling such as ICP which uses loop coils.

According to Paschen's law which indicates the relation between the product of pressure and inter-electrode distance and dielectric breakdown voltage, in a pressure range required for an etching process, the lower the pressure is, the higher discharge maintenance voltage is required (S. Kakuta, et.al., Jpn. J. Appl. Phys. 33 (1994) pp.4335-4339).

Therefore, in the above frequency band (several megahertz to 100 MHz), it is difficult for the parallel plate method to maintain a homogeneous, high density plasma in the low pressure range and the process window in the low pressure range is restricted.

In the inductive coupling method, an induction field is generated in a plasma by applying an electric current to a loop antenna to induce a magnetic field. Contrary to the parallel plate method in which the locus of electrons is determined by the inter-electrode distance, electrons move circularly in the inductive coupling method; therefore, in principle, electrons' moving distance is longer and a higher plasma density can be obtained at low pressures in the inductive coupling method than in the parallel plate method.

However, when a low frequency band of several megahertz to 100 MHz is used for a high frequency power supply, a strong sheath electric field is generated inside the plasma beneath the loop antenna and high-energy ions go into a dielectric window around the area beneath the loop antenna, causing wear of the dielectric window.

On the other hand, when a frequency band of over 100 MHz is used, electrons are trapped in an electric field which varies with time, and thus loss due to diffusion of electrons is reduced; as a consequence, it is possible to maintain the plasma more stable even in a low pressure range and provide a wider process window to deal with a lower pressure range than when a frequency band of 100 MHz or less is used (S. Kakuta, et.al., Jpn. J. Appl. Phys. 33 (1994) pp.4335-4339).

In addition, the sheath electric field is weaker at 100 MHz or more and the energy of ions implanted into the dielectric window decreases, which reduces wear of the dielectric window (T. Kitajima, et al., Appl. Phys. Lett. 77 (2000) pp.489-491).

If we also count discharge methods which use a frequency band of over 100 MHz, in addition to the conventional parallel plate method and inductive coupling method, we should include the following: a method (phase control type) in which electric power with different phases is impressed on a plurality of antenna elements; and a method (antenna length control type) in which the antenna length is an integral multiple of a quarter of the wavelength of the high frequency power to be impressed.

Even when a frequency band of over 100 MHz is used, if the electric field in the inter-electrode direction is the main component of the plasma generating electric field as in the parallel plate method, the component perpendicular to the plasma interface is shielded as the plasma density increases, and the process window in the high density range is restricted. On the other hand, for expansion of the process window to the high density range, it is desirable to use the inductive coupling method which generates a loop induction field from a magnetic field induced by a loop current. However, if a frequency band of over 100 MHz is applied to a conventional loop antenna, a standing wave is excited inside the antenna and a loop induction field cannot be generated. It is also impossible to generate a loop induction field by a method which impresses high frequency power with different phases on a plurality of antenna elements.

Regarding a plasma processing apparatus for use in the manufacture of semiconductors, there is demand not only for an apparatus which can process large-diameter wafers with a high processing uniformity but also for an apparatus which is suitable for the following various processes: a fine etching process with a high anisotropy or selectivity ratio for gate electrodes, metal films and insulating films; an anti-reflective coating process before etching such as BARC (Bottom Anti-reflective Coating) or BARL (Bottom Anti-reflective Layer); a process for making a hard mask as an oxide film or nitride film; a thinning process for controlling the mask size; a trenching process in which the angle, radius or the like is controlled; a post-treatment process which removes etch residue and damaged layers; a sputtering process and so on.

Just taking an etching process concerning formation of transistor gates as example, the process consists of many steps including trenching, anti-reflective coating, mask making and mask thinning, gate formation and subsequent spacer formation. For throughput improvement and prevention of deterioration due to the atmospheric air, the apparatus is expected to be able to carry out all these steps.

In the etching process for formation of wiring layers, a thick upper metal film should be made at high speed for multi-layered wiring. The metal film making step also includes anti-reflective coating, anti-diffusion coating and masking. As in the gate electrode formation process, an apparatus which is capable of carrying out all these tasks is demanded here.

In addition, recently, demand for small-lot diversified production has been growing and the use of wafers which carry various device structures such as system LSIs has been spreading. In order to meet such demand, it is necessary to generate a highly uniform plasma which can be used to treat large-diameter wafers in the following wide processing ranges: a processing pressure range from 0.1 Pa-10 Pa for various seed gases and an ion implantation current range of 0.3 mA/cm-3 mA/cm$^2$ for wafers.

In order to ensure stable, continuous plasma generation to process large-diameter wafers uniformly using a wide range of seed gases under wide-ranging density and pressure conditions, preferably a UHF (100 MHz-3 GHz) high frequency power supply should be used to generate a low-dissociation plasma at low electron temperatures and a wider process window is needed. However, in the conventional inductive coupling method which uses an RF power supply (13.56 MHz), when UHF power is supplied to a loop antenna, a standing wave is excited in the loop antenna and a loop current can not be generated, so an induction electric field cannot be generated, resulting in a failure in generation of a high density plasma.

SUMMARY OF THE INVENTION

The object of the present invention is to provide a plasma processing apparatus which continuously generates plasmas with stability in wide-ranging density, pressure and seed gas conditions while ensuring processing uniformity required for large-diameter wafers and can be used for mass production for an extended period.

In carry out the object, a preferred aspect of the invention is directed to a plasma processing apparatus that comprises: a vessel in which a reduced pressure atmosphere is maintained; a processing table on which a workpiece placed in the vessel is to rest; a dielectric window facing the workpiece; and antenna elements, located behind the dielectric window, which introduce electromagnetic waves into the vessel in order to turn a given gas into a plasma, wherein there are at least two above-mentioned antenna elements which are rotationally symmetrical, and one end of each of the antenna elements is grounded and the other end is electrically connected to a high frequency power supply in the same or virtually same phase.

In this invention, since a plurality of antenna elements (which are shorter than a quarter of the wavelength of the high frequency power) are used, generation of standing waves is suppressed and thus a loop induction electric field can be generated.

Furthermore, the invention provides a wider process window to deal with a low pressure range and a high density range and reduces wear of the inner wall material due to capacitive coupling.

Other and further objects, features and advantages of the invention will appear more fully from the following description.

BRIEF DESCRIPTION OF THE DRAWINGS

FIG. 12 is a sectional view explaining the semiconductor device manufacturing process according to a second embodiment of the present invention.

DETAILED DESCRIPTION OF THE PREFERRED EMBODIMENTS

Embodiment 1

First of all, the structure of antenna elements according to the present invention is described referring to FIG. 1 through FIG. 5B.

Figure 1:
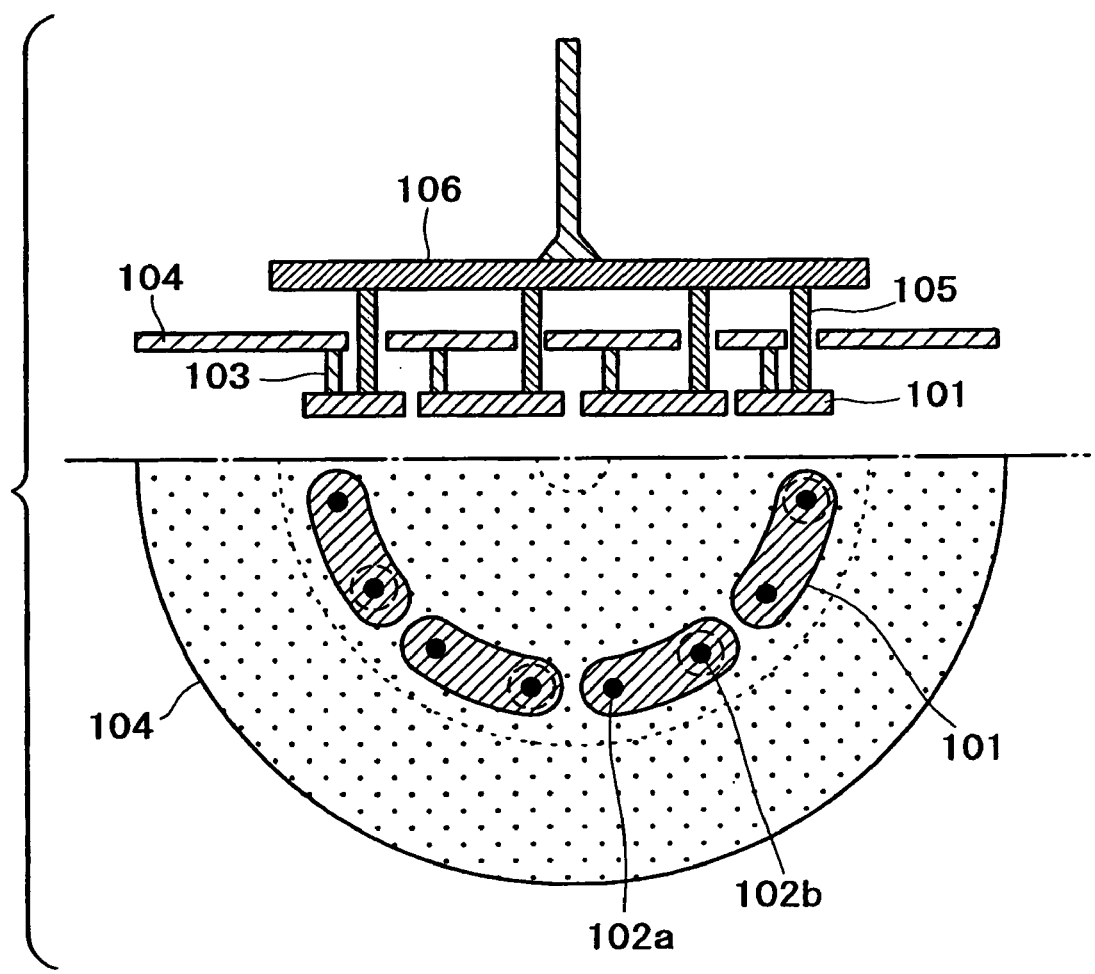
FIG. 1 illustrates an antenna element according to a first embodiment of the present invention.

As shown in FIG. 1, at least two antenna elements whose length is shorter than a quarter of the high frequency wavelength λ are arranged with respect to a conductive plate 104 in a rotationally symmetrical way. Each antenna element has two terminals 102a and 102b. The terminal 102a is grounded by connection through a conductive rod 103 with the conductive plate 104. The terminal 102b is electrically connected with a high frequency distributor 106 in the same phase or virtually same phase through a conductive rod 105 passing through an opening in the conductive plate 104. In other words, in this antenna structure, a high frequency power supply with the same phase is connected to the antenna elements 101 in a way that electric currents flowing through the antenna elements 101 make up a single loop current. This enables generation of inductive coupled plasmas in the high frequency (UHF) band.

These antenna elements require no complicated phase control mechanism because high frequency power from the high frequency power supply is supplied to the antenna elements in the same phase or virtually same phase using a conductive plate for power distribution which is easy to manufacture.

Figure 2A:
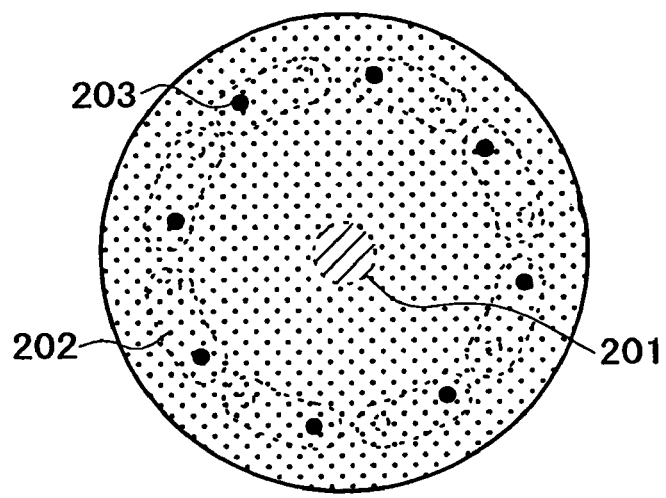
FIG. 2A is a top view of an antenna element divider according to the first embodiment of the present invention.
Figure 2B:
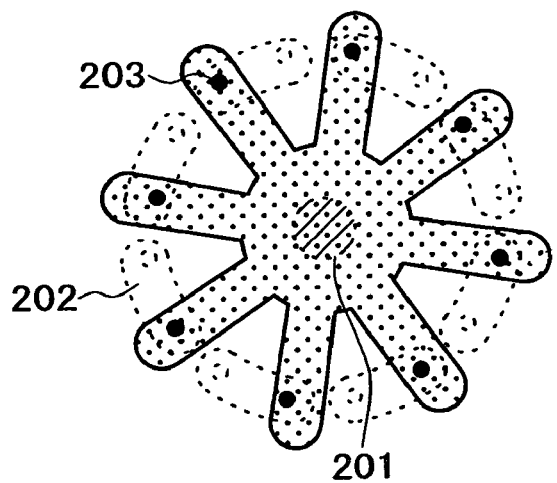
FIG. 2B is a top view of a variation of the antenna element divider according to the first embodiment.
Figure 2C:
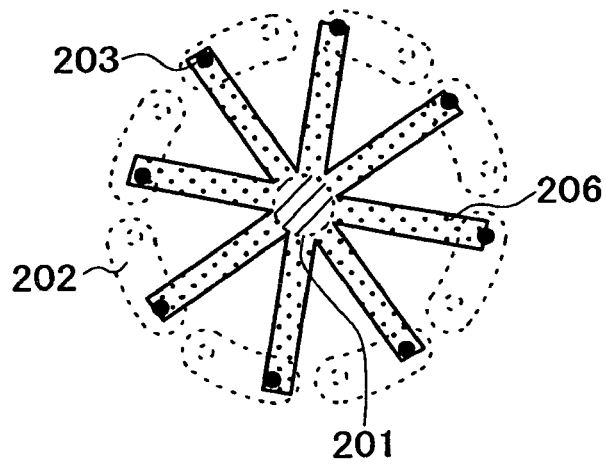
FIG. 2C is a top view of another variation of the antenna element divider according to the first embodiment.

FIGS. 2A to 2C show examples of a divider which distributes power from a high frequency power supply 201 through a connecting terminal 203 to each antenna element 202. FIG. 2A shows a disc type divider which is simple and desirable. However, a star divider like the one shown in FIG. 2B produces the same effect. FIG. 2C shows a divider which uses a coaxial cable 206 for power distribution where the transmission path is designed so as to allow currents flowing through the antenna elements to have the same phase.

Again, referring to FIG. 1, if the conductive plate 106 is used, it would irradiate electromagnetic waves and disturb electromagnetic waves from the antenna elements. Therefore, the grounded conductive plate 104 is located between the antenna elements 101 and the conductive plate 106 and high frequency power is impressed on each antenna element through an opening in the grounded conductive plate 104. This shields the antenna elements from electromagnetic waves irradiated from the conductive plate 106.

Figure 3A:
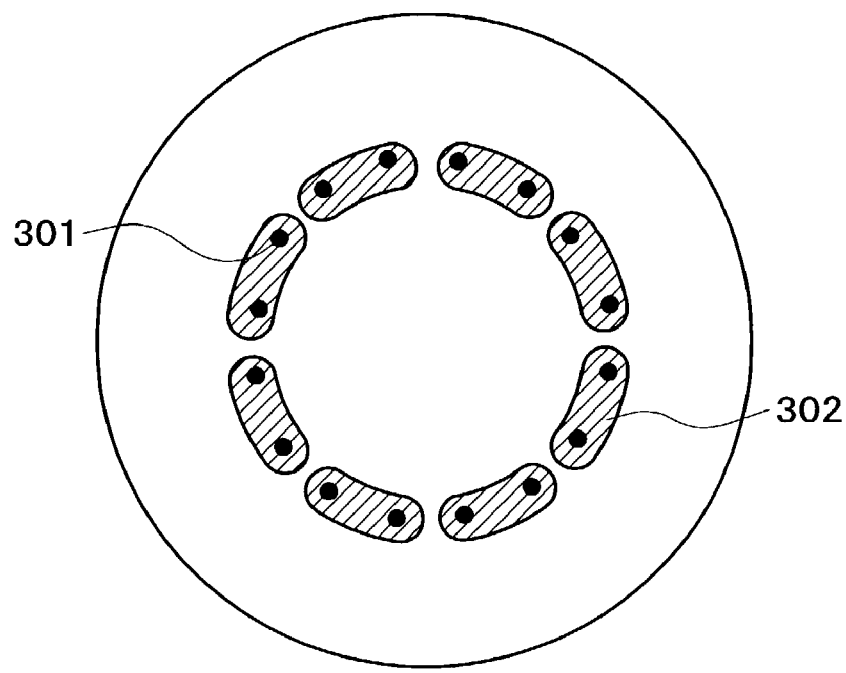
FIG. 3A is a top view showing a rotationally symmetrical antenna element arrangement according to the first embodiment.
Figure 3B:
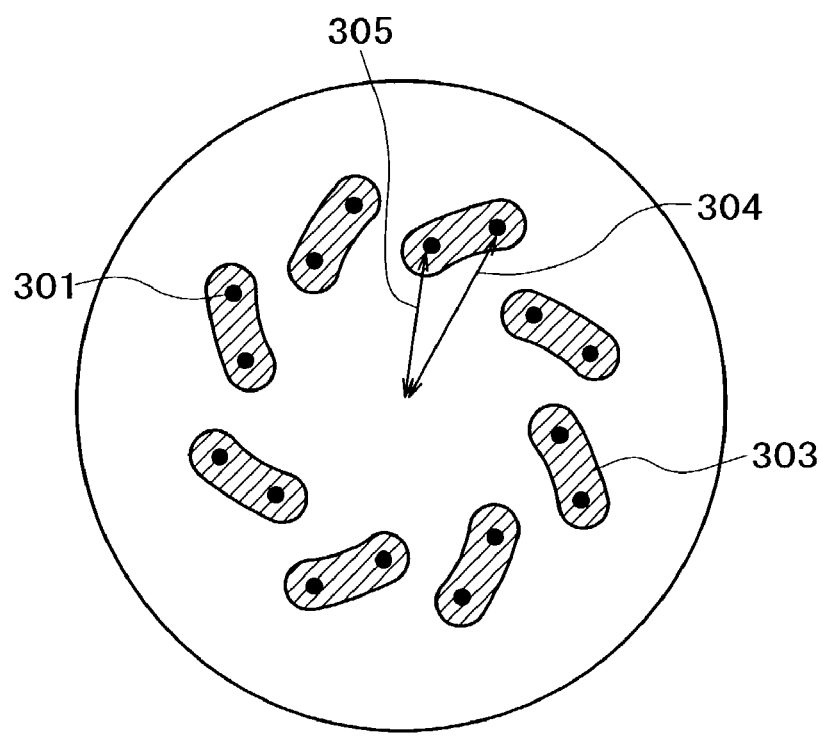
FIG. 3B is a top view showing another rotationally symmetrical antenna element arrangement according to the first embodiment.
Figure 4A:
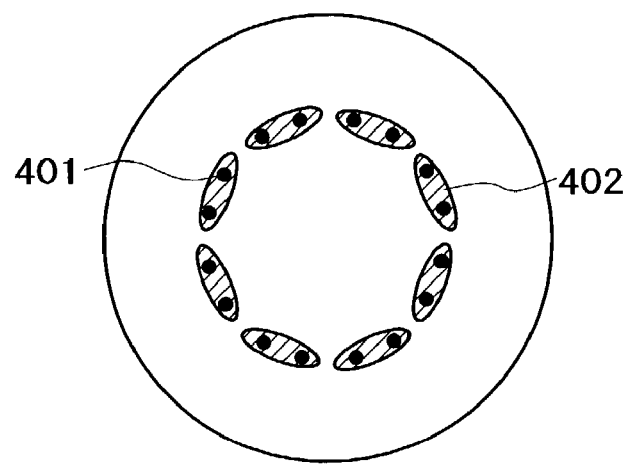
FIG. 4A is a top view showing oval antenna elements according to the first embodiment.
Figure 4B:
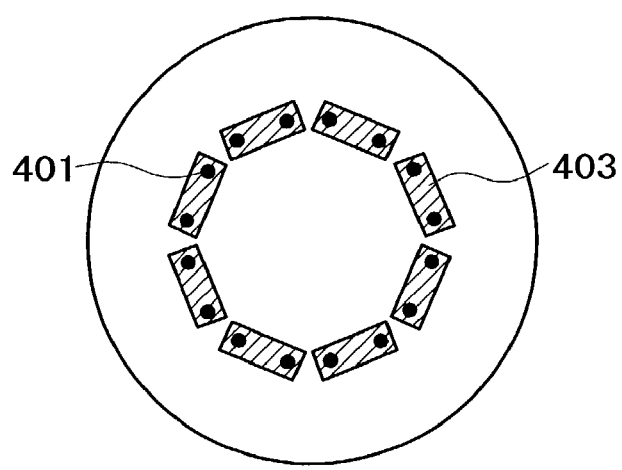
FIG. 4B is a top view showing polygonal antenna elements according to the first embodiment.
Figure 4C:
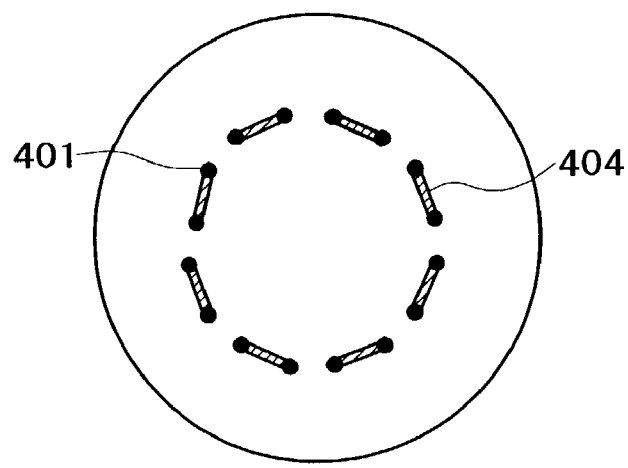
FIG. 4C is a top view showing bar antenna elements according to the first embodiment.

Since the antenna elements are to form a loop current, preferably they should be arc-shaped antenna elements 302 each bearing two terminals 301 and rotationally symmetrical, as illustrated in FIG. 3A. Alternatively, as illustrated in FIG. 3B, it is also possible to use rotationally symmetrical antenna elements 303 in which the distance from the center of rotational symmetry to a grounding terminal 304 and that to a feeding terminal 305 are different. The same effect can be achieved in both cases.

Further, a current flows through an antenna with any shape as far as the antenna bears at least two connecting terminals 401; therefore, the antennas may be oval elements 402 (FIG. 4A), polygonal elements 403 (FIG. 4B) and bar-like elements 404 (FIG. 4C), bringing about the same effect.

Figure 5A:
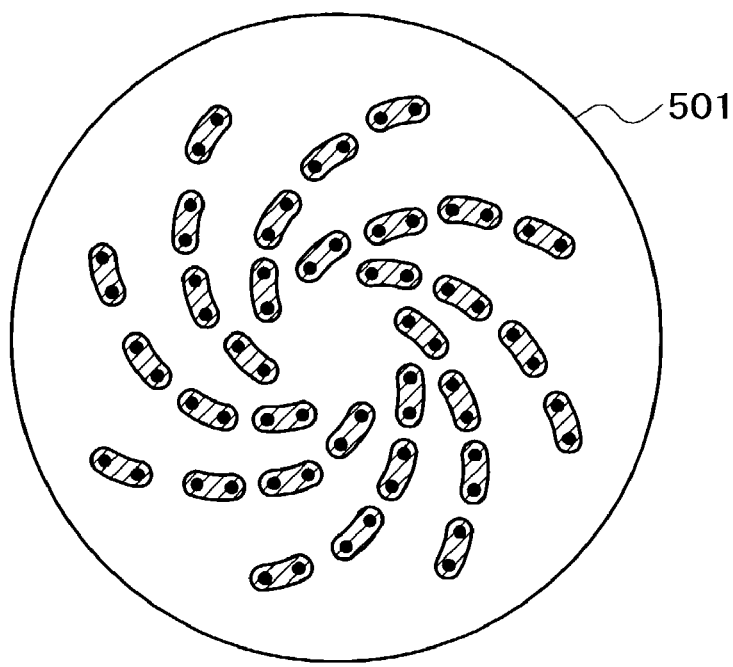
FIG. 5A is a top view showing a spiral antenna element arrangement according to the first embodiment.
Figure 5B:
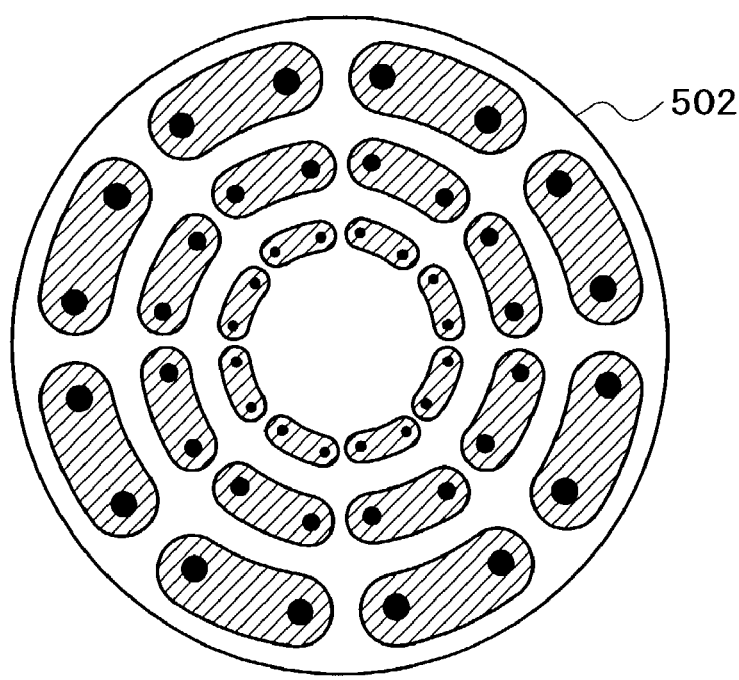
FIG. 5B is a top view showing a concentric antenna element arrangement according to the first embodiment.

The arrangement of the antenna elements may be a spiral arrangement (501) as shown in FIG. 5A, or a concentric arrangement (502) as shown in FIG. 5B. Again, the same effect can be achieved in both cases.

Figure 6A:
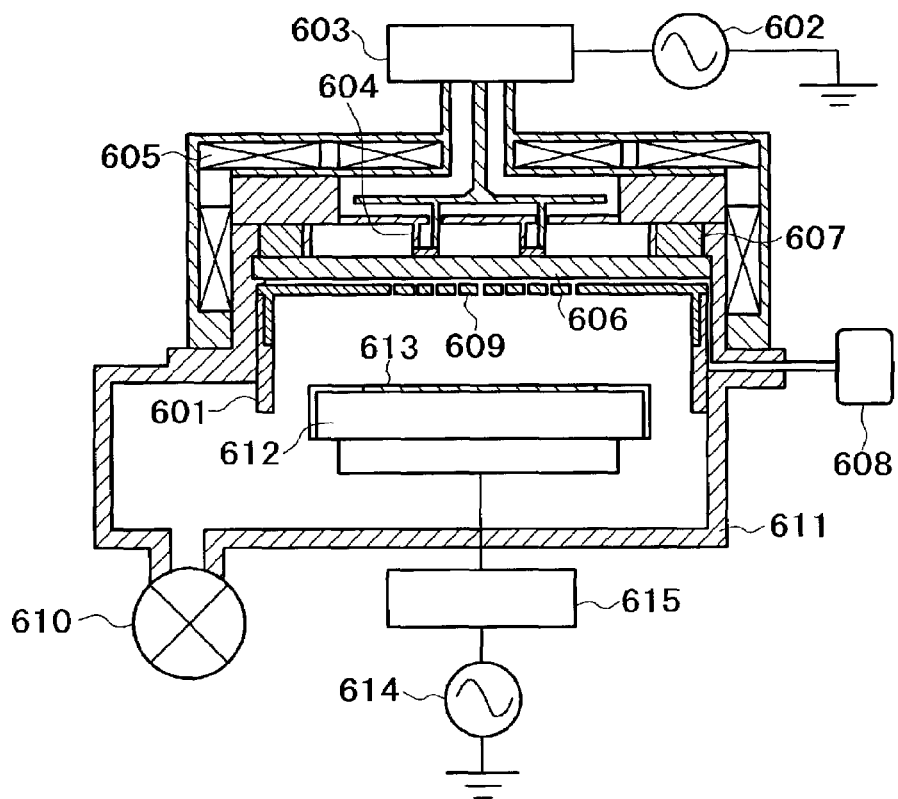
FIG. 6A is a sectional view of a plasma processing apparatus according to the first embodiment.
Figure 6B:
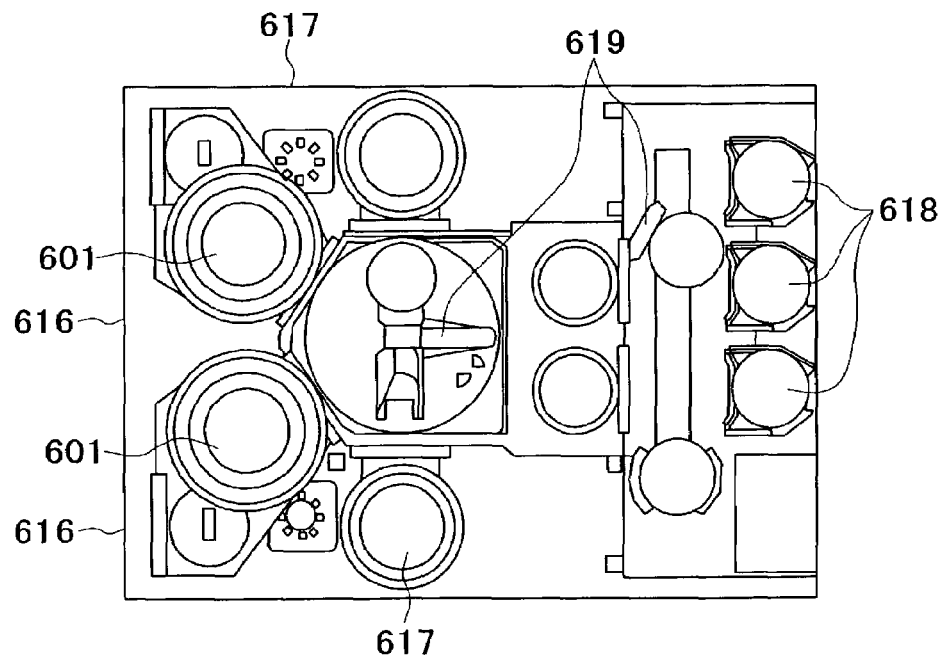
FIG. 6B is a top view of a plasma processing apparatus base frame.

Next, the general structure of an etching system is explained referring to FIGS. 6A and 6B.

In FIG. 6A, electromagnetic waves generated by a high frequency (450 MHz) power supply 602 for plasma generation are introduced through a plasma tuner 603 into an antenna element 604 inside a reactor (vessel) for plasma etching. A magnetic field generated by a magnetic field generation controller 605 is used to generate a plasma efficiently.

As shown in FIG. 1, at least two antenna elements 101 whose length is shorter than a quarter of the high frequency wavelength λ are arranged in a rotationally symmetrical way. One of the two terminals 102 of each antenna element is grounded by connection through the conductive rod 103 with the conductive plate 104, and the other terminal is electrically connected through the high frequency distributor 106 with the high frequency power supply in the same or virtually same phase, by the conductive rod 105 passing through an opening in the conductive plate 104.

The standing wave controller 607, located in the peripheral area above a quartz top plate (dielectric window) 606, controls plasma distribution in the vicinity of the side wall.

Process gas which is introduced through a gas inlet 608 passes through a shower plate 609 and enters the plasma etching reactor 601.

The plasma etching reactor 601 and magnetic field generation controller 604 are mounted on a base frame 611 with a ventilation facility 610. Concretely, the ventilation facility 610 consists of an evacuation device such as a turbo-molecular pump. This evacuation device 610 reduces the pressure inside the plasma etching reactor (vessel) 601 to a prescribed pressure level.

A wafer to be processed 613 (300 mm in diameter) is transported into the plasma etching reactor (vessel) 601 whose inner pressure is maintained at the prescribed low level, and loaded on a processing table 612 with a lift mechanism. High frequency power generated by a bias power supply (400 kHz) 614 is impressed through a bias matching box 615 onto the wafer 613.

FIG. 6B shows the general structure of a base frame as viewed from above. The plasma etching reactor 601 as shown in FIG. 6A rests on a base frame 616. Here, two plasma etching reactors 601 constitute an etching system. In this etching system, efficient parallel processing for mass production can be made. In this embodiment, one of the reactors is used for evaluation of etching results.

Also, on the same base frame are two reactors for plasma ashing 617 which are used to remove a photoresist mask or polymer on the surface of an etched wafer.

Wafer cassette holders 618 serve as a waiting place for an unetched wafer or a waiting place for an etched wafer. The wafer is conveyed to various places by a wafer conveyor robot 619.

Next, comparison is made between the conventional method (which uses UHF band power) and the first embodiment of the present invention in terms of structure and characteristics (electric field component distribution in the plasma generator).

Figure 7A:
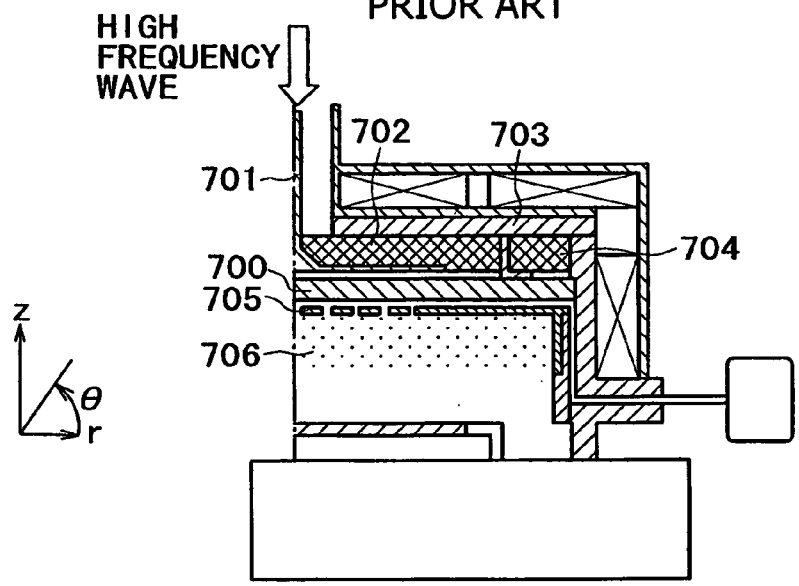
FIG. 7A is a fragmentary sectional view of a conventional plasma processing apparatus.

FIG. 7A outlines a UHF-ECR plasma processing apparatus based on the conventional method which uses UHF band power.

An antenna element 701 in the form of a conductive plate and an antenna spacer 702 made of alumina ($Al_2O_3$) are provided on a quartz top plate (dielectric window) 700. In the periphery of the antenna element, there is a standing wave controller consisting of an L-shaped conductive choke 703 and a ring 704 of alumina ($Al_2O_3$). This enables control of plasma distribution in the vicinity of the side wall.

Figure 7B:
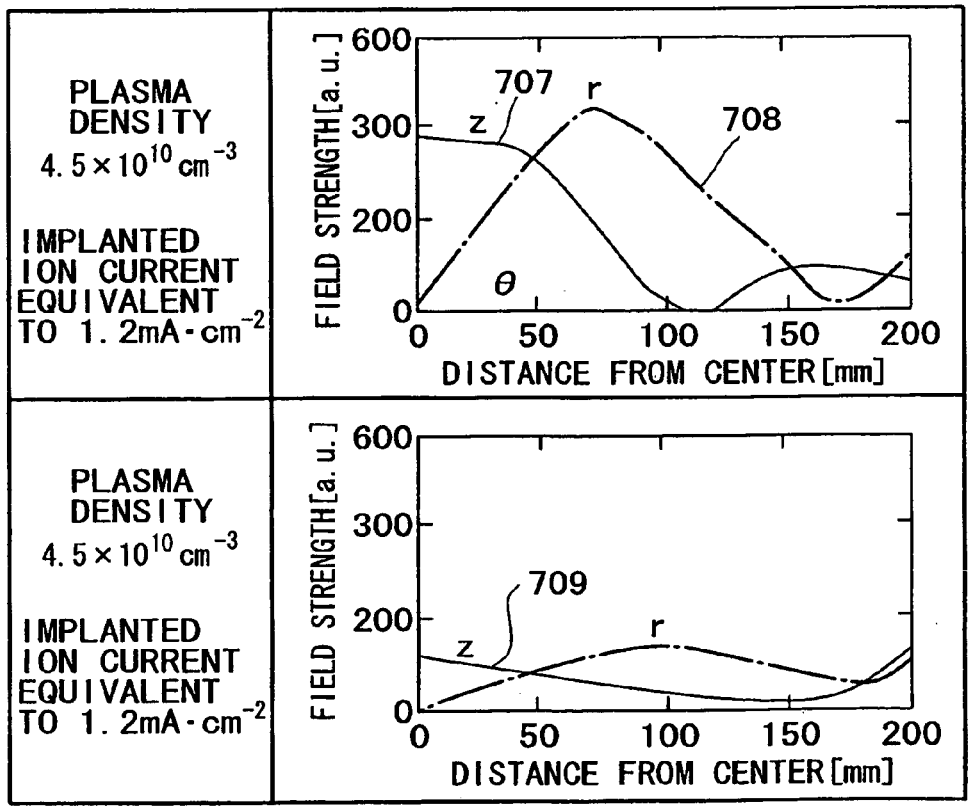
FIG. 7B shows graphs concerning electric field component distribution in the conventional plasma processing apparatus.

FIG. 7B shows an example of estimation by calculation of electric field component distribution in a plasma generator 706 located beneath a shower plate 705 as shown in FIG. 7A.

At a plasma density of $4.5 \times 10^{10}$ $cm^{-3}$ (equivalent to 1.2 $mA/cm^2$ in terms of implanted ion current (ICF)), the electric field z-axis component 707 is the main component around the center and the field strength of the r component 708 peaks at an antenna element end, indicating that the field strength is high in the area around the center. Theoretically, the θ component does not exist. A plasma is initially generated in the high field strength area and diffused outwards so that ion currents are uniformly incident on a wafer. However, when the plasma density is increased to $9.0 \times 10^{10}$ $cm^{-3}$ (equivalent to 2.5 $mA/cm^2$ in terms of ICF), the electric field z-axis component, which is perpendicular to the plasma interface, is reflected by a plasma so the electromagnetic wave from the antenna element does not spread into the plasma. As a consequence, there occurs a tendency of plasma density saturation with respect to input power in the high-power range, which restricts the high plasma density range.

Figure 8A:
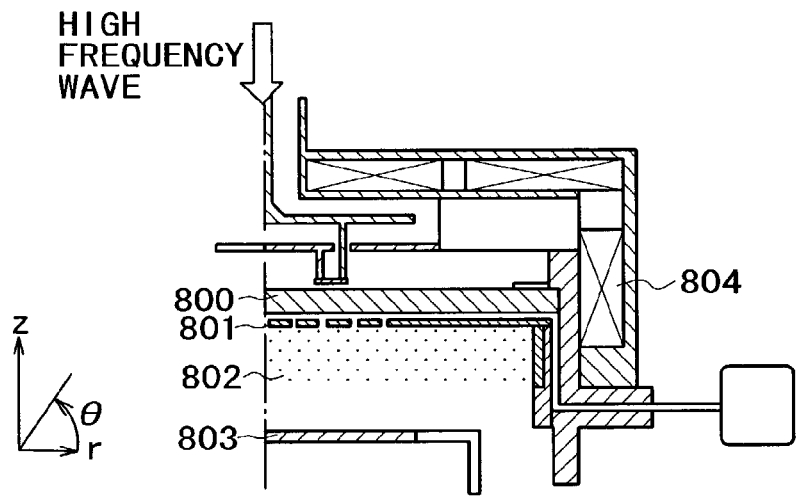
FIG. 8A is a fragmentary sectional view of a plasma processing apparatus according to the first embodiment.
Figure 8B:
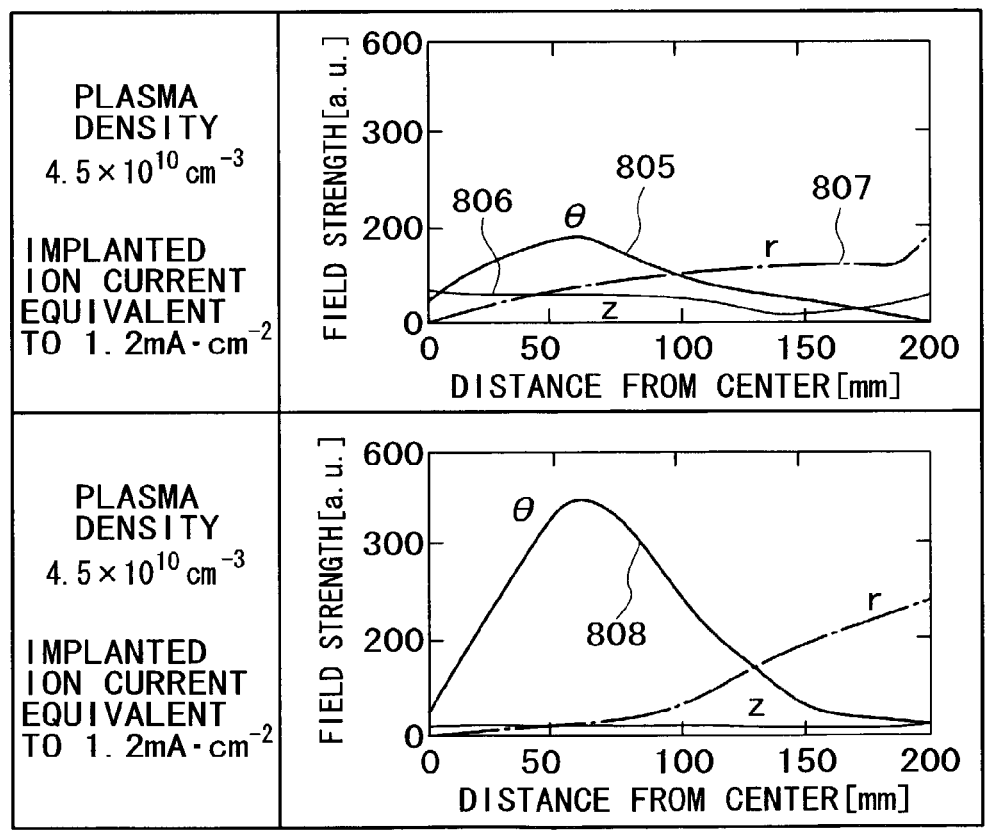
FIG. 8B shows graphs concerning electric filed component distribution the plasma processing apparatus according to the first embodiment.

By contrast, FIG. 8A is a fragmentary sectional view outlining a plasma processing apparatus according to the first embodiment of the present invention. FIG. 8B shows an example of estimation by calculation of electric field component distribution in a plasma generator 802 located beneath a shower plate 801 according to this embodiment. In this example, the antenna structure is the same as shown in FIG. 1. There is no standing wave controller in the peripheral area of a quartz top plate 800.

Since the conductive rods 103 and 105 on the antenna elements 101 are so arranged as to be in the same phase, electric current flows on the surfaces of the antenna elements in the same direction of rotation. It is desirable that the phase of electromagnetic wave applied to the antenna elements be identical; however, as far as the phase difference is within the range of −10 to 10 degrees, the same effect can be achieved. Also, even if there is some error in rotational symmetry due to thermal expansion or working inaccuracy of metal elements, the same effect can be still achieved provided that the rotational direction of electric currents flowing through the antenna elements is identical. This rotational flow of current generates an induction field in the z-axis direction, which leads to generation of an induction field in the θ direction. At a plasma density of $4.5 \times 10^{10}$ cm$^{-3}$ (equivalent to 1.2 mA/cm$^2$ in terms of implanted ion current (ICF)), the field strength of the θ component 805 peaks at the area beneath the antenna elements.

In contrast to the conventional apparatus shown in FIG. 7A, there is little z-axis component 806 of the electric field around the center and the field strength of the r component 807 is higher in an area nearer to the side wall. When the plasma density is increased to $9.0 \times 10^{10}$ cm$^{-3}$ (equivalent to 2.5 mA/cm$^2$ in terms of ICF), the electric field θ component 808, which is parallel to the plasma interface, is not reflected by a plasma; it spreads and thus generates a plasma. Therefore, clearly in this method, the electric field θ component can be used to control plasma even in the high power range and obtain a high plasma density.

Figure 9A:
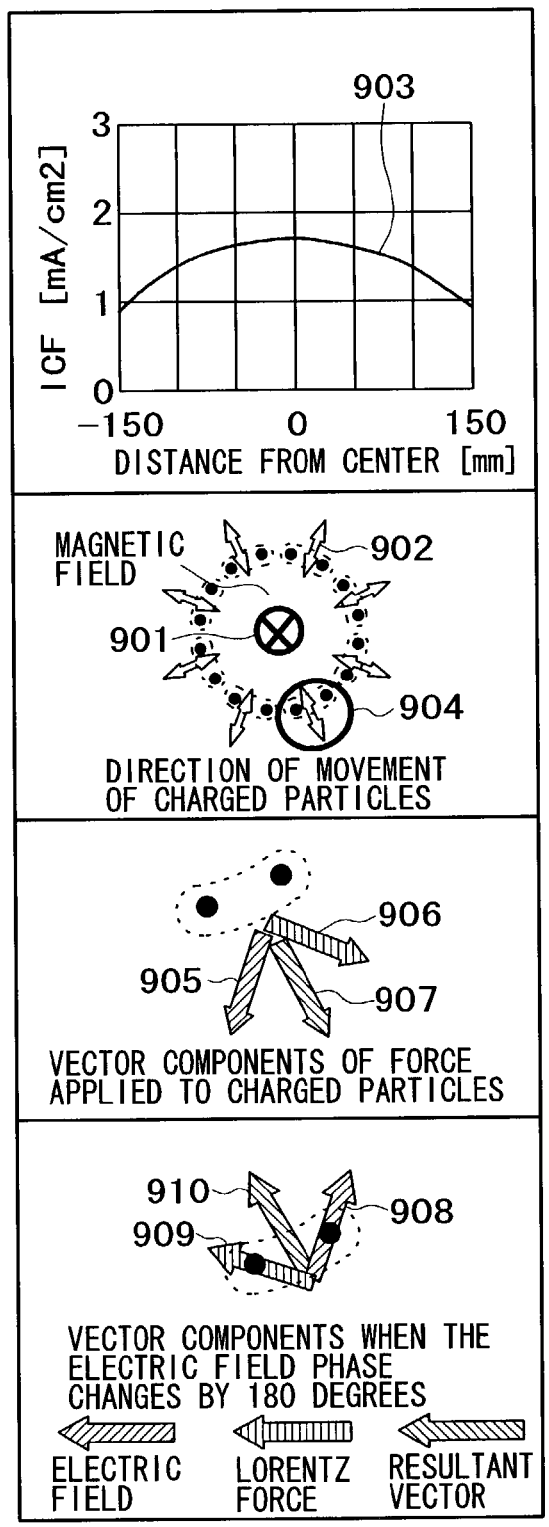
FIG. 9A shows dependency of ICF distribution on magnetic field vector concerning a plasma processing apparatus according to the first embodiment where the field is facing downward.
Figure 9B:
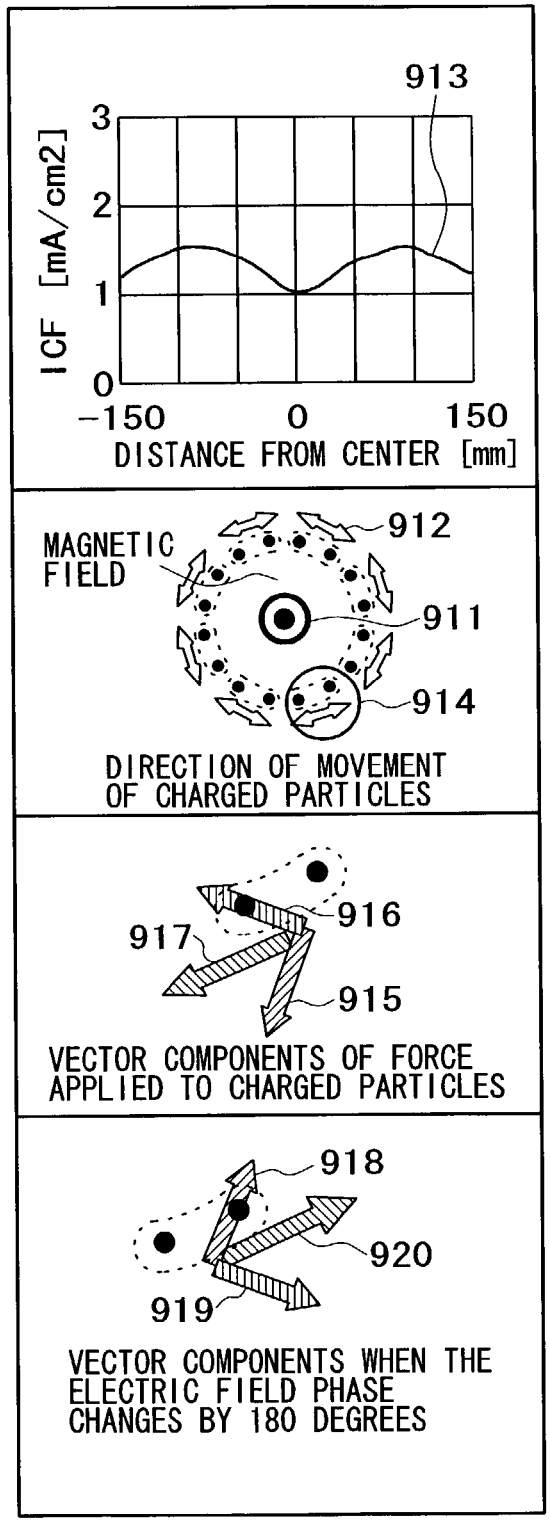
FIG. 9B shows dependency of ICF distribution on magnetic field vector concerning a plasma processing apparatus according to the first embodiment where the field is facing upward.

In the plasma processing apparatus shown in FIG. 8A., the presence of electric field in the θ direction (θ component) has been confirmed by measurement of currents (ICF) of ions incident on the surface of a wafer 803. In this apparatus, a magnetic field can be applied by an external coil 804. FIGS. 9A and 9B show ICF distribution as observed when the orientation of the coil magnetic field is reversed.

As shown in FIG. 8B, the electric field generated in this embodiment includes the electric field θ component 805 and the electric field r component 807, so the electric field is spiral in an actual plasma.

When the electric field 901 is facing downward as shown in FIG. 9A, charged particles in plasma are subjected to an external radial vibration force 902, resulting in a gibbous ICF distribution 903. Looking at the behavior of charged particles in a certain part 904, there is Lorentz force 906 in the direction perpendicular to the spiral electric field 905. As a result, the charged particles in plasma are subjected to an outward force 907.

When there is an electromagnetic wave phase difference of 180 degrees, the spiral electric field 908 is oriented in the opposite direction and there is Lorentz force 909 perpendicular to it, so the charged particles in plasma are subjected to an inward force 910 contrary to the case that the magnetic field 901 is facing downward.

Consequently, when the magnetic field 901 is facing downward, the charged particles in plasma are subjected to a radial vibration force 902 and thus the ICF distribution 903 is diffusive.

On the other hand, when the electric field 911 is facing upward as shown in FIG. 9B, the charged particles in plasma are subjected to an external rotational vibration force 912, resulting in an M-shaped ICF distribution 913. Looking at the behavior of charged particles in a certain part 914, there is Lorentz force 916 in the direction perpendicular to the spiral electric field 915. As a result, the charged particles in plasma are subjected to a rotational force 917.

When there is an electromagnetic wave phase difference of 180 degrees, the spiral electric field 918 is oriented in the opposite direction and there is Lorentz force 919 perpendicular to it, so the charged particles in plasma are subjected to a rotational force 920 contrary to the case that the magnetic field 911 is facing upward.

Consequently, when the magnetic field 911 is facing upward, the charged particles in plasma are subjected to a rotational vibration force 912 and thus the ICF distribution 913 is M-shaped, which reflects the distribution in the plasma generator.

As explained above, it has been demonstrated that the θ component of the electric field can be generated according to the present invention. Here, it is possible to make the ICF distribution selective not only by changing the magnetic field strength but also by changing the direction (positive/negative) of the magnetic field vector, namely the direction of the coil current (positive/negative). Besides, when a permanent magnet is used to generate a similar magnetic field instead of a solenoid coil, the same effect can be achieved.

Next, for comparison of the plasma characteristics obtained by the apparatus illustrated in FIGS. 6A and 6B with those by the conventional UHF-ECR illustrated in FIGS. 7A and 7B, FIGS. 10A to 10C show the result of examination of ICF uniformity and ICF's linearity with respect to electromagnetic wave power when the gases employed are Cl$_2$, HBr and O$_2$ and the pressure is set to 0.4 Pa.

Regarding an ICF distribution 1001 (FIG. 10A) obtained by the conventional UHF-ECR, when the electromagnetic wave power is increased from 500 W to 800 W, the ICF distribution (curve) remains almost uniform though the curve is slightly M-shaped, and the current density increases with some tendency of saturation.

On the other hand, regarding an ICF distribution 1002 (FIG. 10B) obtained by the plasma processing apparatus according to the present invention (FIGS. 6A and 6B), when the electromagnetic wave power is increased from 500 W to 800 W, the ICF distribution (curve) changes from a slightly gibbous curve to a flatter curve with an almost flat central area, and the current density increases.

Figure 10A:
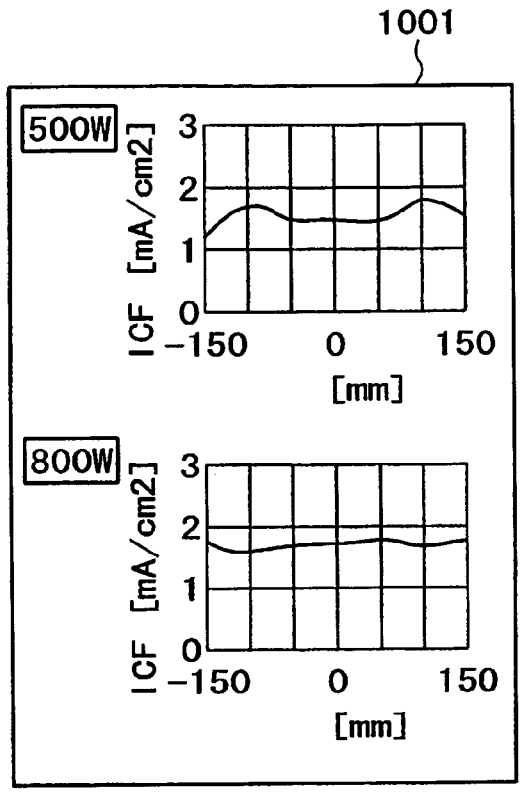
FIG. 10A shows ICF distribution uniformity and linearity in the ICF vs. UHF power relation concerning a conventional plasma processing apparatus.
Figure 10B:
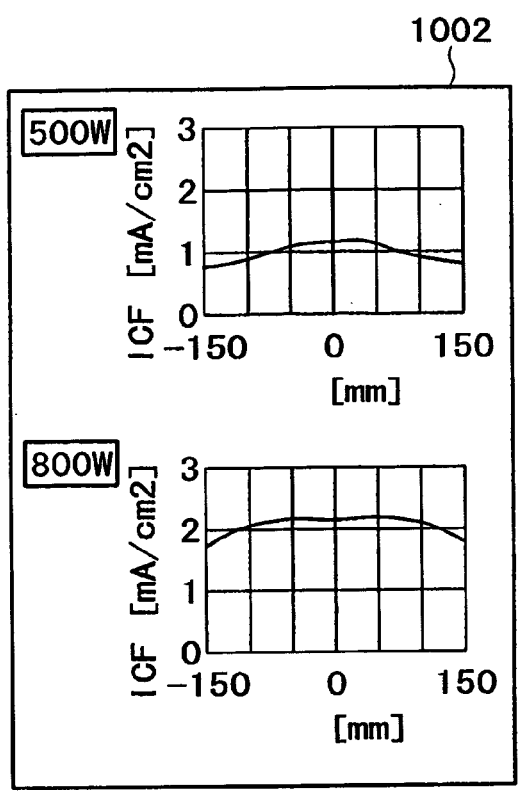
FIG. 10B shows ICF distribution uniformity and linearity in the ICF vs. UHF power relation concerning a plasma processing apparatus according to the first embodiment.
Figure 10C:
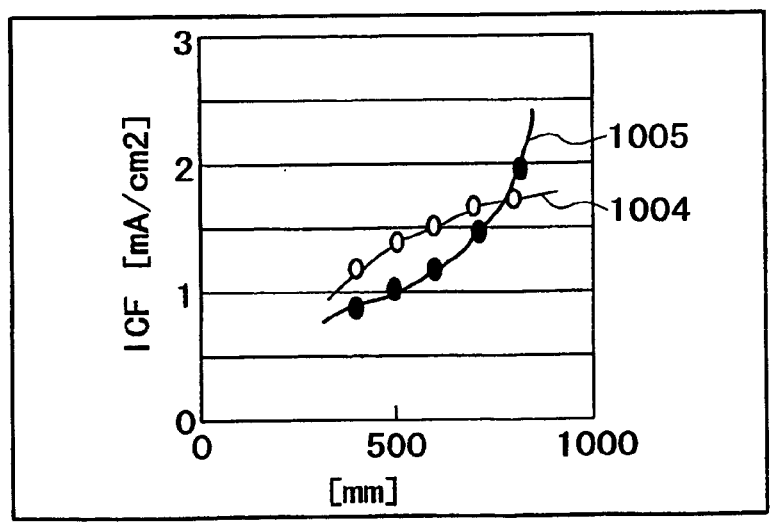
FIG. 10C compares ICF distribution curves of the conventional apparatus and the first embodiment.

For comparison of ICF's linearity with respect to electromagnetic wave power between both cases 1101 and 1102, FIG. 10C shows ICF versus UHF curves in which the horizontal axis represents electromagnetic wave power and the vertical axis represents average ICF values within the 300 mm distance surface area. The ICF distribution curve 1004 obtained by the conventional UHF-ECR indicates some tendency of saturation at 500 W and more, while the ICF distribution curve 1005 obtained by this embodiment shows a tendency of exponential growth with the plasma density increasing at 800 W and more, thereby permitting a high plasma density to be attained.

In connection with the plasma processing apparatus as shown in FIGS. 6A and 6B, FIGS. 11A and 11B show ICF distribution in different gas systems to examine the multi-step serial processing capability as mentioned earlier.

Figure 11A:
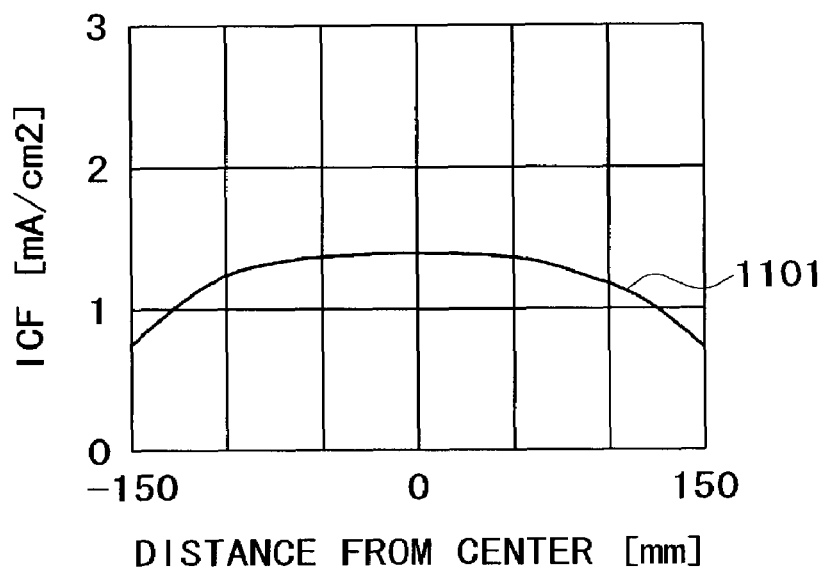
FIG. 11A shows dependency of ICF distribution on gas concerning a plasma processing apparatus according to the first embodiment where the poly-silicon etching condition is used.
Figure 11B:
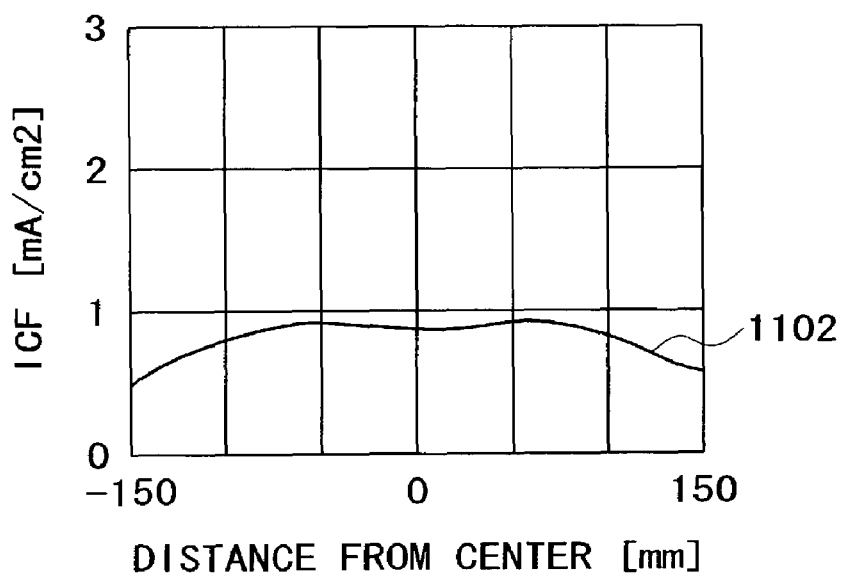
FIG. 11B shows dependency of ICF distribution on gas concerning a plasma processing apparatus according to the first embodiment where the BARC etching condition is used

FIG. 11A indicates the result of ICF distribution measurement in which the poly-silicon etching condition 1101 is used (the gas system employs $Cl_2$, HBr, and $O_2$); and FIG. 11B indicates the result of ICF distribution measurement in which the BARC etching condition 1102 is used (the gas system employs Ar, $CF_4$, HBr, and $O_2$). The distribution curves are similar between both the gas systems, namely there is little difference in ICF distribution between the gas systems. This justifies an expectation for a wide process window which enables various materials to be processed.

Embodiment 2

Next, a semiconductor manufacturing method as a second embodiment of the present invention is described.

For the plasma processing apparatus shown in FIGS. 6A and 6B, we examined a serial etching process for gate formation which uses a single reduced pressure vessel as an example of a gate electrode making process. The state after gate electrode formation is illustrated in FIG. 12.

For ArF photoresist 1201 thinning with an oxygen-halogen mixture and etching for $CF_4$-based BARC 1202, a high selectivity is required, so for etching with silicon nitride 1203 (hard mask), a high plasma density is needed because of the low etchability of coating. For etching with poly-silicon 1204, treatment in a low pressure condition is necessary to achieve verticality. On the other hand, for over-etching, a high selectivity ratio of poly-silicon 1204 and base silicon oxide 1205 is required and thus treatment in a high pressure condition is necessary. Therefore, a wider process window is needed to meet different processing conditions required for different layers.

Since the plasma processing apparatus according to the present invention provides a wider process window to deal with a high density range, the above series of steps can be carried out efficiently and all necessary treatments for the mask material, anti-reflective coating and gate material can be performed in the same chamber with a high throughput. In comparison with a conventional method where different serial processes are carried out using different dedicated apparatuses and a wafer is conveyed from one apparatus to another or where different serial processes are carried out in an apparatus having plural dedicated reduced pressure vessels, the method used in this embodiment saves time required for wafer loading into, or wafer unloading from, the dedicated apparatuses or reduced pressure vessels.

Even when the photoresist coating or anti-reflective coating is of a different type, processing time is shortened. This structure, which uses only one reduced pressure vessel, makes it possible to cope with wide-ranging processing conditions, thereby offering a great advantage for improvement of mass production efficiency.

Embodiment 3

A semiconductor device manufacturing method as a third embodiment of the present invention is described below.

Figure 13:
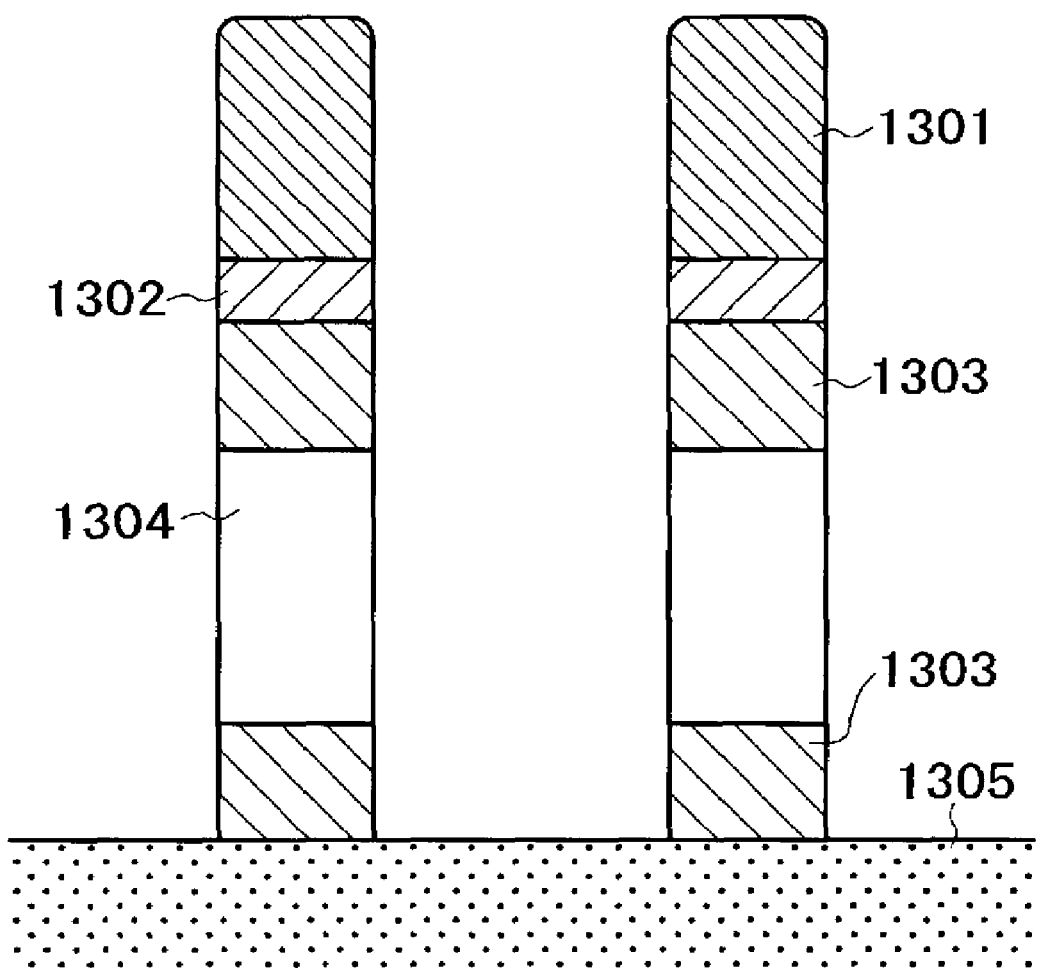
FIG. 13 is a sectional view explaining the semiconductor device manufacturing process according to a third embodiment of the present invention.

FIG. 13 shows an example of metal (aluminum) wiring made on a wafer surface by etching using the apparatus according to the present invention (FIGS. 6A and 6B). The layers for wiring lie one upon another from top to bottom: a photoresist layer 1301, an anti-reflective coating 1302, a titanium nitride layer 1303, an aluminum layer 1304, a titanium nitride layer 1303 and a silicon oxide layer 1305. Chlorine and boron trichloride are used as etching gases.

First, to make BARL 1302 as an anti-reflective coating, a selectivity with respect to the top photoresist layer 1301 is needed and a high bias is necessary to make the titanium nitride layer 1303. Also, in making the aluminum layer 1304, a high vertical processing accuracy and high speed etching with high density plasma are needed. For over-etching, a high selectivity ratio with respect to the base oxide layer 1305 is required.

The plasma processing apparatus according to the present invention provides a wider process window to deal with a high density range and serially carries out the above various processing steps for the mask material, anti-reflective coating and metal wiring material in the same chamber with a high throughput.

In the plasma processing apparatus according to the invention, other semiconductor processing steps based on physical and chemical action of activated particles of plasma, such as CVD and sputtering, can be performed with high uniformity under wide-ranging conditions.

The features of the semiconductor device manufacturing method according to the above second and third embodiments are summarized as follows.

(1) A semiconductor device manufacturing method uses a plasma processing apparatus comprising: a vessel in which a reduced pressure atmosphere is maintained; a processing table on which a wafer placed in the vessel is to rest; a dielectric window facing the wafer; and antenna elements, located behind the dielectric window, which introduce electromagnetic waves into the vessel in order to turn a given gas into a plasma, with the presence of at least two above-mentioned antenna elements which are rotationally symmetrical, one end of each of the antenna elements being grounded and the other end being electrically connected to a high frequency power supply in the same or virtually same phase. In this apparatus, a wafer to be processed is loaded on the processing table and a loop current which flows through the antenna elements is controlled so that the wafer is continuously or intermittently surface-treated.

(2) In the method as mentioned above in (1), continuous or intermittent surface treatment is made in a single reduced pressure vessel with at least two types of film materials or processing conditions by controlling a loop current which flows through the antenna elements.

(3) In the method as mentioned above in (1), continuous or intermittent surface treatment is made with at least two types of film materials or processing conditions by controlling a loop electric field in the vicinity of the antenna elements.

(4) In the method as mentioned above in (1), continuous or intermittent surface treatment is made in a single reduced pressure vessel with at least two types of film materials or processing conditions by controlling a loop electric field in the vicinity of the antenna elements.

(5) A semiconductor device manufacturing method uses a plasma processing apparatus comprising: a vessel in which a reduced pressure atmosphere is maintained; a processing table on which a wafer placed in the vessel is to rest; a dielectric window facing the wafer; and antenna elements, located behind the dielectric window, which introduce electromagnetic waves into the vessel in order to turn a given gas into a plasma, with the presence of at least two above-mentioned antenna elements which are rotationally symmetrical, one end of each of the antenna elements being grounded and the other end being electrically connected to a high frequency power supply in the same or virtually same phase. In this apparatus, a wafer on which a gate electrode is to be made is loaded on the processing table and a loop current which flows through the antenna elements is controlled so that the wafer is continuously or intermittently surface-treated.

As discussed so far, according to the present invention, a plasma processing apparatus which uses high frequency power generates a plasma by induction coupling to process workpieces (samples) uniformly under wide-ranging conditions (seed gases, pressures and densities), and especially provides a wider process window to enable processing in low pressure and high plasma density conditions. In addition, according to the invention, it is possible to handle all many steps or multi-layering steps for gate electrode formation and metal wiring using a single reduced pressure vessel. This contributes to increased production efficiency and improved throughput in the manufacture of semiconductor devices.

The foregoing invention has been described in terms of preferred embodiments. However, those skilled, in the art will recognize that many variations of such embodiments exist. Such variations are intended to be within the scope of the present invention and the appended claims.

What is claimed is:

1. A plasma processing apparatus comprising:
   (a) a vessel in which a reduced pressure atmosphere is maintained;
   (b) a processing table on which a workpiece placed in said vessel is to rest;
   (c) a dielectric window arranged to face the workpiece on said processing table; and
   (d) plural antenna elements, located behind the dielectric window, which introduce electromagnetic waves into said vessel in order to turn a given gas into a plasma,
   wherein:
   the plural antenna elements include at least two antenna elements which are disposed in a plane so as to be rotationally symmetrically arranged and spaced circumferentially from each other about an axis of symmetry, and so as to be electrically separated from each other in said plane,
   each of said at least two antenna elements has one end portion which is grounded and another end portion which is electrically connected to a high frequency power supply,
   each of said at least two antenna elements has a non-loop configuration, and
   an entire length of each of said at least two antenna elements is spaced from said axis of symmetry and subtends an acute angle having a vertex at said axis of symmetry.

2. The plasma processing apparatus as defined in claim 1, wherein the frequency of the high frequency power supply is between 100 MHz and 3 GHz.

3. The plasma processing apparatus as defined in claim 1, wherein each of said at least two antenna elements is shorter in length than a quarter of a wavelength λ of the high frequency power supply.

4. The plasma processing apparatus as defined in claim 1, wherein a distance between a feeding end and grounding end of each of said at least two antenna elements is longer than 7 mm and shorter than 750 mm.

5. The plasma processing apparatus as defined in claim 1, wherein each of said at least two antenna elements is longer than 7 mm and shorter than 750 mm.

6. The plasma processing apparatus as defined in claim 1, wherein distances from a center of rotational symmetry to respective grounding terminals of said at least two antenna elements are substantially equal, and distances from said center to respective feeding terminals of said at least two antenna elements are substantially equal.

7. The plasma processing apparatus as defined in claim it wherein the plural antenna elements are arranged on plural concentric circles.

8. The plasma processing apparatus as defined in claim 1, wherein the plural antenna elements are spirally arranged.

9. The plasma processing apparatus as defined in claim 1, wherein a shape of each of said at least two antenna elements is an arc.

10. The plasma processing apparatus as defined in claim 1, wherein a shape of each of said at least two antenna elements is a bar, oval or polygon.

11. The plasma processing apparatus as defined in claim 1, wherein power is supplied from the high frequency power supply through an opening in a grounded conductive plate to each of said at least two antenna elements.

12. The plasma processing apparatus as defined in claim 1, wherein power is supplied from the high frequency power supply through an opening in a flat plate conductor to each of said at least two antenna elements.

13. The plasma processing apparatus as defined in claim 1, wherein power is supplied from the high frequency power supply through a coaxial cable to each of said at least two antenna elements.

14. The plasma processing apparatus as defined in claim 1, wherein said reduced pressure vessel incorporates a magnetic field controller which applies a magnetic field.

15. The plasma processing apparatus as defined in claim 1, wherein the dielectric window is made of alumina ($Al_2O_3$) or quartz ($SiO_2$) or a combination of these.

16. The plasma processing apparatus as defined in claim 1, wherein said at least two antenna elements include respective plate members disposed substantially in the same plane.

17. The plasma processing apparatus as defined in claim 1, wherein, for each of said at least two antenna elements, points of the antenna element that are most distant from each other along a circumferential direction about said axis of symmetry are disposed substantially at opposite longitudinal ends of the antenna element.

18. A plasma processing apparatus comprising:
   (a) a vessel in which a reduced pressure atmosphere is maintained;
   (b) a processing table on which a semiconductor wafer placed in said vessel is to rest;
   (c) a dielectric window arranged to face the semiconductor wafer on said processing table; and
   (d) plural antenna elements, located behind the dielectric window, which introduce electromagnetic waves into said vessel in order to turn a given gas into a plasma,
   wherein:
   the plural antenna elements include at least two antenna elements which are disposed in a plane so as to be rotationally symmetrically arranged and spaced circumferentially from each other about an axis of symmetry, and so as to be electrically separated from each other in said plane, each of said at least two antenna elements has one end portion which is grounded and another end portion which is electrically connected to a high frequency power supply, each of said at least two antenna elements has a non-loop configuration, and an entire length of each of said at least two antenna elements is spaced from said axis of symmetry and subtends an acute angle having a vertex at said axis of symmetry.

19. The plasma processing apparatus as defined in claim 18, wherein said dielectric window includes a quartz plate.

20. The plasma processing apparatus as defined in claim 18, wherein said at least two antenna elements include respective plate members disposed substantially in the same plane.

21. The plasma processing apparatus as defined in claim 18, wherein, for each of said at least two antenna elements, points of the antenna element that are most distant from each other along a circumferential direction about said axis of symmetry are disposed substantially at opposite longitudinal ends of the antenna element.

22. A plasma processing apparatus comprising:
(a) a vessel;
(b) an evacuation device which is connected with said vessel in order to maintain a reduced pressure atmosphere in said vessel;
(c) a processing table on which a semiconductor wafer placed in said vessel is to rest;
(d) a dielectric window arranged to face the semiconductor wafer on said processing table; and
(e) plural antenna elements, located behind the dielectric window, which introduce electromagnetic waves into said vessel in order to turn a given gas into a plasma, wherein:
the plural antenna elements include at least two antenna elements which are disposed in a plane so as to be rotationally symmetrically arranged and spaced circumferentially from each other about an axis of symmetry, and so as to be electrically separated from each other in said plane, each of said at least two antenna elements has one end portion which is grounded and another end portion which is electrically connected to a high frequency power supply, each of said at least two antenna elements has a non-loop configuration, and and entire length of each of said at least two antenna elements is spaced from said axis of symmetry and subtends an acute angle having a vertex at said axis of symmetry.

23. The plasma processing apparatus as defined in claim 22, wherein the frequency of the high frequency power supply is between 100 MHz and 3 GHz.

24. The plasma processing apparatus as defined in claim 22, wherein each of said at least two antenna elements is shorter in length than a quarter of wavelength $\lambda$ of the high frequency power supply.

25. The plasma processing apparatus as defined in claim 22, wherein distances from a center of rotational symmetry to respective grounding terminals of said at least two antenna elements are substantially equal, and distances from said center to respective feeding terminals of said at least two antenna elements are substantially equal.

26. The plasma processing apparatus as defined in claim 22, wherein the plural antenna elements are arranged on plural concentric circles.

27. The plasma processing apparatus as defined in claim 22, wherein the plural antenna elements are spirally arranged.

28. The plasma processing apparatus as defined in claim 22, wherein said dielectric window includes a quartz plate.

29. The plasma processing apparatus as defined in claim 22, wherein said at least two antenna elements include respective plate members disposed substantially in the same plane.

30. The plasma processing apparatus as defined in claim 22, wherein, for each of said at least two antenna elements, points of the antenna element that are most distant from each other along a circumferential direction about said axis of symmetry are disposed substantially at opposite longitudinal ends of the antenna element.

31. A plasma processing apparatus comprising:
(a) a vessel in which a reduced pressure atmosphere is maintained;
(b) a processing table on which a workpiece placed in said vessel is to rest;
(c) a dielectric window arranged to face the workpiece on said processing table; and
(d) plural antenna elements, located behind the dielectric window which introduce electromagnetic waves into said vessel in order to turn a given gas into a plasma, wherein:
the plural antenna elements include at least one group of two or more antenna elements which are disposed in a plane so as to be rotationally symmetrically arranged and spaced circumferentially from each other about an axis of symmetry, and so as to be electrically separated from each other in said plane, each antenna element of each said group has a non-loop configuration, and an entire length of each antenna element of each said group is spaced from said axis of symmetry and subtends an acute angle having a vertex at said axis of symmetry.

32. The plasma processing apparatus as defined in claim 31, wherein the antenna elements of each said group have respective first end portions which are grounded and respective second end portions which are electrically connected to a high frequency power supply in substantially the same phase.

33. The plasma processing apparatus as defined in claim 31, wherein the frequency of the high frequency power supply is between 100 MHz and 3 GHz.

34. The plasma processing apparatus as defined in claim 31, wherein each of said at least two antenna elements is shorter in length than a quarter of a wavelength $\lambda$ of the high frequency power supply.

35. The plasma processing apparatus as defined in claim 31, wherein, for each group of antenna elements, distances from a center of rotational symmetry to respective grounding terminals of the antenna elements are substantially equal, and distances from said center to respective feeding terminals of the antenna elements are substantially equal.

36. The plasma processing apparatus as defined in claim 31, including a plurality of said antenna element groups arranged on concentric circles.

37. The plasma processing apparatus as defined in claim 31, including a plurality of said antenna element groups arranged to form a spiral pattern.

38. The plasma processing apparatus as defined in claim 31, wherein the antenna elements of said at least one group are arc-shaped.

39. The plasma processing apparatus as defined in claim 31, wherein the antenna elements of said at least one group are bar, oval or polygon shaped.

40. The plasma processing apparatus as defined in claim 31, wherein power is supplied from the high frequency power supply through an opening in a grounded conductive plate to the plural antenna elements.

41. The plasma processing apparatus as defined in claim 31, wherein the antenna elements of each said group include respective plate members disposed substantially in the same plane.

42. The plasma processing apparatus as defined in claim 31, wherein, for each of antenna element of each said group, points of the antenna element that are most distant from each other along a circumferential direction about said axis of symmetry are disposed substantially at opposite longitudinal ends of the antenna element.

* * * * *